(12) United States Patent
Martin et al.

(10) Patent No.: US 8,100,012 B2
(45) Date of Patent: Jan. 24, 2012

(54) MEMS SENSOR WITH CAP ELECTRODE

(75) Inventors: John R. Martin, Foxborough, MA (US); Xin Zhang, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 406 days.

(21) Appl. No.: 12/013,208

(22) Filed: Jan. 11, 2008

(65) Prior Publication Data

US 2008/0168838 A1 Jul. 17, 2008

Related U.S. Application Data

(60) Provisional application No. 60/879,903, filed on Jan. 11, 2007.

(51) Int. Cl.
*G01P 15/125* (2006.01)
*G01P 1/02* (2006.01)

(52) U.S. Cl. ..................... 73/514.32; 73/493

(58) Field of Classification Search ............. 73/514.32, 73/514.38, 514.36, 493, 431, 510, 511, 504.12
See application file for complete search history.

(56) References Cited

U.S. PATENT DOCUMENTS

| | | | |
|---|---|---|---|
| 4,499,655 A | 2/1985 | Anthony | |
| 5,089,880 A | 2/1992 | Meyer et al. | |
| 5,229,647 A | 7/1993 | Gnadinger | |
| 5,326,726 A | 7/1994 | Tsang et al. | |
| 5,355,022 A | 10/1994 | Sugahara et al. | |
| 5,388,460 A * | 2/1995 | Sakurai et al. ............. 73/514.32 |
| 5,392,651 A * | 2/1995 | Suzuki et al. ............. 73/514.32 |
| 5,417,111 A | 5/1995 | Sherman et al. | |
| 5,511,428 A | 4/1996 | Goldberg et al. | |
| 5,610,431 A | 3/1997 | Martin | |
| 5,620,931 A | 4/1997 | Tsang et al. | |
| 5,719,336 A * | 2/1998 | Ando et al. ................. 73/514.32 |
| 6,158,280 A | 12/2000 | Nonomura et al. | |
| 6,196,067 B1 * | 3/2001 | Martin et al. ............... 73/514.32 |
| 6,236,115 B1 | 5/2001 | Gaynes et al. | |
| 6,263,735 B1 * | 7/2001 | Nakatani et al. ........... 73/514.36 |
| 6,294,400 B1 * | 9/2001 | Stewart et al. .................. 438/52 |
| 6,297,072 B1 | 10/2001 | Tilmans et al. | |
| 6,307,169 B1 | 10/2001 | Sun et al. | |
| 6,323,550 B1 | 11/2001 | Martin et al. | |
| 6,335,224 B1 | 1/2002 | Peterson et al. | |
| 6,384,353 B1 | 5/2002 | Huang et al. | |
| 6,405,592 B1 * | 6/2002 | Murari et al. .................... 73/493 |
| 6,429,511 B2 | 8/2002 | Ruby et al. | |
| 6,433,411 B1 | 8/2002 | Degani et al. | |

(Continued)

FOREIGN PATENT DOCUMENTS

EP 0786645 A2 7/1997

(Continued)

OTHER PUBLICATIONS

International Search Report dated Oct. 31, 2008.

(Continued)

*Primary Examiner* — Helen C. Kwok
(74) *Attorney, Agent, or Firm* — Sunstein Kann Murphy & Timbers LLP

(57) ABSTRACT

A MEMS sensor includes a substrate having a MEMS structure movably attached to the substrate, a cap attached to the substrate and encapsulating the MEMS structure, and an electrode formed on the cap that senses movement of the MEMS structure.

9 Claims, 4 Drawing Sheets

U.S. PATENT DOCUMENTS

| | | |
|---|---|---|
| 6,436,853 B2 | 8/2002 | Lin et al. |
| 6,448,622 B1 | 9/2002 | Franke et al. |
| 6,504,253 B2 | 1/2003 | Mastromatteo et al. |
| 6,504,385 B2 * | 1/2003 | Hartwell et al. ............ 73/514.32 |
| 6,621,168 B2 | 9/2003 | Sundahl et al. |
| 6,625,367 B2 | 9/2003 | Coult et al. |
| 6,753,208 B1 | 6/2004 | MacIntyre |
| 6,853,067 B1 | 2/2005 | Cohn et al. |
| 6,906,395 B2 | 6/2005 | Smith |
| 6,909,146 B1 | 6/2005 | Linn et al. |
| 6,911,727 B1 | 6/2005 | Martin et al. |
| 6,933,163 B2 | 8/2005 | Yun et al. |
| 6,962,835 B2 | 11/2005 | Tong et al. |
| 7,034,393 B2 | 4/2006 | Alie et al. |
| 7,204,737 B2 * | 4/2007 | Ding et al. ....................... 445/24 |
| 7,220,614 B2 | 5/2007 | Martin |
| 7,258,011 B2 * | 8/2007 | Nasiri et al. ............... 73/514.32 |
| 7,291,561 B2 | 11/2007 | Ma et al. |
| 7,334,491 B2 | 2/2008 | Rudhard et al. |
| 7,578,186 B2 * | 8/2009 | Matsuhisa .................. 73/504.12 |
| 2004/0232500 A1 | 11/2004 | Rudhard et al. |
| 2004/0259325 A1 * | 12/2004 | Gan ............................. 438/456 |
| 2005/0003652 A1 | 1/2005 | Ramanathan et al. |
| 2005/0170609 A1 | 8/2005 | Alie et al. |
| 2005/0229710 A1 * | 10/2005 | O'Dowd et al. ................ 73/718 |
| 2005/0269678 A1 | 12/2005 | Martin et al. |
| 2006/0118946 A1 | 6/2006 | Alie et al. |
| 2006/0199297 A1 * | 9/2006 | Kim et al. ....................... 438/52 |
| 2007/0004080 A1 * | 1/2007 | Ouyang ........................ 438/106 |

FOREIGN PATENT DOCUMENTS

| | | |
|---|---|---|
| EP | 0794558 A1 | 9/1997 |
| EP | 1 219 565 A1 | 7/2002 |
| EP | 1262781 A1 | 12/2002 |
| EP | 1 296 374 A1 | 3/2003 |
| WO | 96/13062 | 5/1996 |
| WO | 01/56921 A2 | 8/2001 |
| WO | 02/093122 A2 | 11/2002 |

OTHER PUBLICATIONS

Y. Tomita et al.; Advanced Packaging Technologies on 3D Stacked LSI Utilizing the Micro Interconnections and the Layered Microthin Encapsulation, IEEE, May 29, 2001, pp. 347-355.

Boustedt et al.; Flip Chip as an Enabler for MEMS Packaging, 2002 Electronic Components and Technology Conference, pp. 124-128.

Ok et al.; Generic, Direct-Chip-Attach MEMS Packaging Design with High Density and Aspect Ratio through-Wafer Electrical Interconnect, 2002 Electronic Components and Technology Conference, pp. 232-237.

MEMS: Mainstream Process Integration, Ziptronix White Paper, 7 pages.

Teomim et al.; An Innovative Approach to Wafer-Level MEMS Packaging, Solid State Technology, printed Dec. 2, 2002, 3 pages.

ShellBGA, www.shellcase.com/pages/products-shellbga.asp, printed Dec. 2, 2002, 2 pages.

Seeger et al.; Fabrication Challenges for Next-Generation Devices: Microelectromechanical Systems for Radio-Frequency Wireless Communications, J. Microlith., Microfab., Microsyst., vol. 2, No. 3, Jul. 2003, pp. 169-177.

Park et al.; A Novel Low-Loss Wafer-Level Packaging of the RF-MEMS Devices, 2002 IEEE, Doc. No. 0-7803-7185, Feb. 2002, pp. 681-684.

Ok et al.; High Density, High Aspect Ratio Through-Wafer Electrical Interconnect Vias for MEMS Packaging, 2003 IEEE Transactions on Advanced Packaging, vol. 26, No. 3, Doc. No. 1521-3323, Aug. 2003, pp. 302-309.

Premachandran et al.; A Novel Electrically Conductive Wafer Through Hole Filled Vias Interconnect for 3D MEMS Packaging, 2003 Electronic Components and Technology Conference, pp. 627-630.

Ando et al.; New Packaging Technology for SAW Device, Corporate Components Development Center, Doc. No. WA1-3, pp. 403-406, Dec. 1995.

Chavan et al.; A Monolithic Fully-Integrated Vacuum-Sealed CMOS Pressure Sensor, 2000 IEEE, Doc. No. 0-7803-5273-4/00, pp. 341-346.

Wolffenbuttel; Low-Temperature Intermediate Au-Si Wafer Bonding; Eutectic or Silicide Bond, Sensors and Actuators A 62 (1997) pp. 680-686.

Martin; Wafer Capping of MEMS with Fab-Friendly Metals, Analog Devices Inc., Micromachined Products Division, SPIE presentation, Jan. 19, 2007.

* cited by examiner

MEMS SENSOR WITH CAP ELECTRODE

CROSS-REFERENCE TO RELATED APPLICATIONS

This patent application claims priority to U.S. Provisional Patent Application No. 60/879,903 filed Jan. 11, 2007, entitled MEMS DEVICE WITH ALUMINUM BASED OR SIMILAR CAP BONDING OR ELECTRODE, the disclosure of which is incorporated by reference herein in its entirety.

FIELD OF THE INVENTION

The invention generally relates to an electrode for MEMS sensors and, more particularly, the invention relates to a cap electrode for measuring z-axis movement in MEMS sensors.

BACKGROUND OF THE INVENTION

A variety of different applications use sensor systems to detect the movement of an underlying object or the presence of a substance or condition in a particular environment, such as sensors that detect motion, light, pressure, humidity, sound and gases. Sensors employing microelectromechanical systems (MEMS) devices are increasingly used in such applications due to their relatively small size and their capability to detect relatively small amounts or changes in the measured item.

MEMS devices typically employ a movable, inertial mass or flexible membrane formed with one or more fixed, non-moving structures or fingers. For example, in a MEMS accelerometer, the inertial mass may be suspended in a plane above a substrate and movable with respect to the substrate. The movable structure and the fixed structures form a capacitor having a capacitance that changes when the movable structure moves relative to the fixed structures in response to applied forces, such as along a predetermined axis of the device, e.g., x- and y-axes. For example, commercial MEMS accelerometers that sense linear motion in the x-, y- and z-axes may have electrodes positioned above, below and/or on opposing sides of the inertial mass to allow measurement of differential capacitance in each axis. This type of design generally offers high sensitivity to linear acceleration with minimal temperature or stress sensitivity. Because of the mechanical moving structures involved and the typical required device sensitivities, MEMS devices are commonly covered with a cap structure to protect the MEMS structures from hazards that may impact the functioning of the device, e.g., from gases, particles, moisture, etc.

MEMS devices are commonly made by a sequence of thin film depositions and etches performed on a substrate. Typically, the substrate is formed from a single crystal silicon wafer or a silicon-on-insulator ("SOI") wafer. As known by those in the art, an SOI wafer has an insulator layer between two single crystal silicon layers with the inertial mass and fixed fingers typically formed in the top silicon layer. Designs based on SOI wafers may measure in-plane (x- and y-axes) acceleration, but are generally less satisfactory for measuring out-of-plane or z-axis movement. This is because it is difficult to form an electrode under the inertial mass. Solutions such as the widely known "teeter-totter" do exist. One can also use the handle/bottom silicon layer as the ground and drive the inertial mass to sense z-axis motion capacitively. This approach, however, is susceptible to various drift mechanisms.

SUMMARY OF THE INVENTION

In accordance with one embodiment of the invention, a MEMS sensor includes a substrate having a MEMS structure movably attached to the substrate, a cap attached to the substrate and encapsulating the MEMS structure, and an electrode formed on the cap that senses movement of the MEMS structure.

In accordance with related embodiments, the MEMS sensor may include a reference electrode formed coplanar with the MEMS structure and attached to the substrate. The substrate may be an SOI wafer or a silicon wafer. The MEMS sensor may include a second electrode formed on the substrate beneath the MEMS structure. The electrode may be formed from aluminum, copper, gold or their alloys. The cap may include a conductive seal ring formed from aluminum or an aluminum alloy. The MEMS sensor may be an inertial sensor, a pressure sensor, a fluid sensor or a microphone. The substrate may further include electronic circuitry formed on or in the substrate.

In accordance with another embodiment of the invention, a method of producing a MEMS sensor that senses motion in the z-axis is disclosed. The method includes providing a substrate having a MEMS structure movably attached to the substrate, forming an electrode on a cap, and attaching the cap to the substrate so that the cap encapsulates the MEMS structure and the electrode senses movement of the MEMS structure.

In accordance with related embodiments, the method may further include forming a reference electrode coplanar with the MEMS structure, wherein the cap encapsulates the MEMS structure and the reference electrode. The method may further include forming a seal ring on the cap, wherein the seal ring is used to attach the cap to the substrate. Forming the electrode and forming the seal ring may be performed during the same processing step. The electrode and the seal ring may be formed from aluminum or an aluminum alloy. Attaching the cap may include thermocompression bonding the seal ring on the cap to a corresponding aluminum-based ring on the substrate. Forming an electrode on the cap may include depositing a layer of aluminum or aluminum alloy on the cap and etching the layer to leave a seal ring and the electrode surrounded by the seal ring. The substrate may be an SOI wafer or a silicon wafer. The method may include forming a second electrode on the substrate beneath the MEMS structure. The substrate may further include electronic circuitry formed on or in the substrate. The electrode may be formed from copper, gold or their alloys.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

Embodiments of the present invention provide a cap with an electrode for measuring z-axis movement of a MEMS device in a MEMS sensor. The cap electrode is positioned above the movable MEMS structure with a well-controlled gap, allowing the electrode to sense changes in capacitance as the movable structure moves in the z-axis. The cap electrode may be used with MEMS devices formed on single crystal silicon wafers or SOI wafers. Details of illustrative embodiments are discussed below.

Although the following discussion describes various relevant steps of forming a MEMS device and cap electrode, it does not describe all the required steps. Other processing steps may also be performed before, during, and/or after the discussed steps. Such steps, if performed, have been omitted for simplicity. The order of the processing steps may also be varied and/or combined. Accordingly, some steps are not described and shown. Similarly, although the following discussion involves inertial sensors, principles of illustrative embodiments may apply to other sensor devices, such as MEMS pressure sensors, MEMS microphones and MEMS fluid sensors. As known to those skilled in the art, fluid sensors may sense gases, liquids and/or multiphase compositions. Accordingly, discussion of inertial sensors is exemplary and is not intended to limit the scope of various embodiments of the invention.

Figure 1:
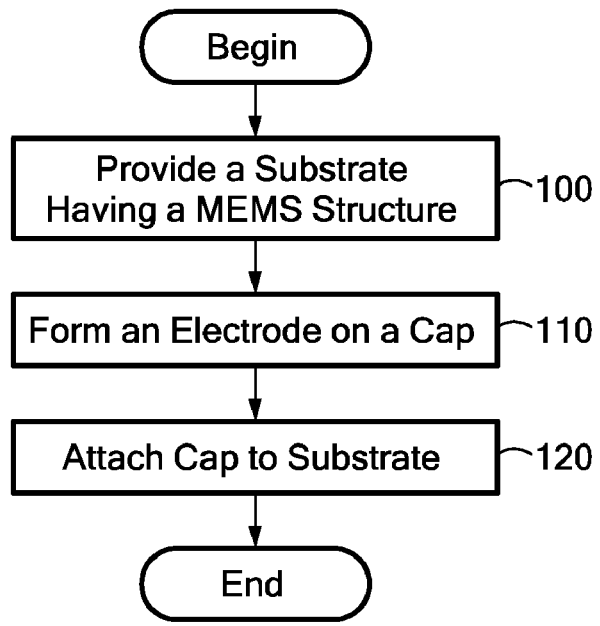
FIG. 1 shows a process of producing a MEMS sensor with a cap electrode according to embodiments of the present invention.
Figure 2:
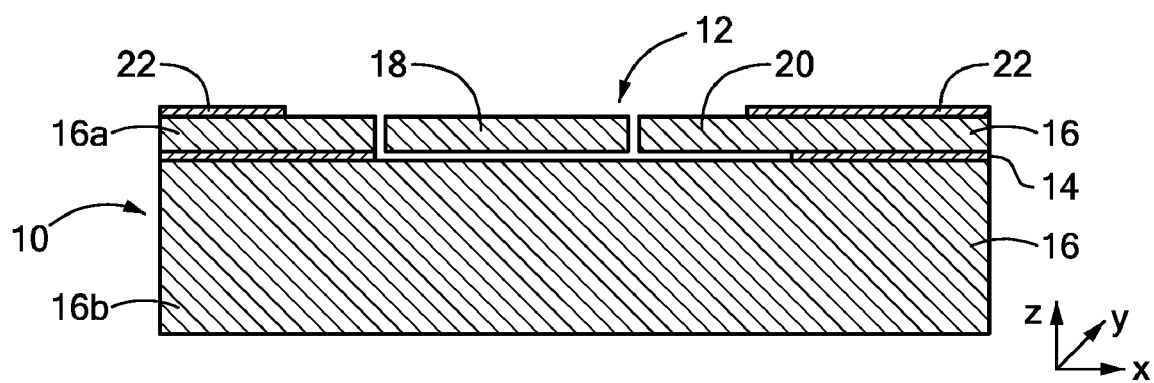
FIG. 2 schematically shows a cross-sectional view of a MEMS device according to embodiments of the present invention.

FIG. 1 shows a process of producing a MEMS sensor with a cap electrode according to illustrative embodiments of the present invention. The process begins at step 100, which provides a substrate having a MEMS structure movably attached to the substrate. For example, FIG. 2 schematically shows a cross-sectional view of a substrate 10 having a MEMS structure 12 formed therein according to an embodiment of the present invention. The substrate 10 may be formed from a silicon wafer or an SOI wafer. As known by those in the art, one or more layers may be formed on the surface of the substrate and the MEMS structure 12 may be formed on top of the substrate (in the case of a silicon wafer) or in the top layer of the substrate (in the case of an SOI wafer). The layers may include one or more layers of materials typically used in the manufacture of a MEMS device, such as an oxide layer, a polysilicon layer, a nitride layer, etc., as is well known to those skilled in the art. The various layers may be masked off or patterned using processes well known to those skilled in the art, e.g., using photolithography and etching techniques.

For simplicity, FIG. 2 is further described using an SOI wafer, which has an insulator layer 14 (e.g., an oxide) between two silicon layers 16. The MEMS structure 12 includes a movable, inertial mass 18 formed in the top silicon layer 16a and suspended above the bottom silicon layer 16b. The MEMS structure 12 is movably attached to the substrate 10 (not shown) as is well known to those skilled in the art. The substrate 10 may also have a reference mass or electrode 20 formed in the top silicon layer 16a, adjacent to, and coplanar with, the inertial mass 18 and partially suspended above the bottom silicon layer 16b. As is well known to those skilled in the art, both the inertial mass 18 and the reference electrode 20 are suspended above the bottom silicon layer 16b by an equal distance since the gap is caused by the removal of the dielectric layer 14 under both structures 18, 20 during the release step. The reference electrode 20 may be used when measuring the z-axis movement of the inertial mass 18 (e.g., up and down movement as shown in FIG. 2) to increase the accuracy of the measurement, as will be described in further detail below. The reference electrode 20 may also be used when measuring the x-axis movement of the inertial mass 18 (e.g., right and left as shown in FIG. 2) and a similar reference electrode (not shown) may be used for measuring the y-axis movement (e.g., in and out of the page as shown in FIG. 2). In some embodiments, a dielectric layer 22 may be formed on the top silicon layer 16a to electrically isolate the MEMS device from subsequent layers or structures attached to the substrate 10.

Figure 3:
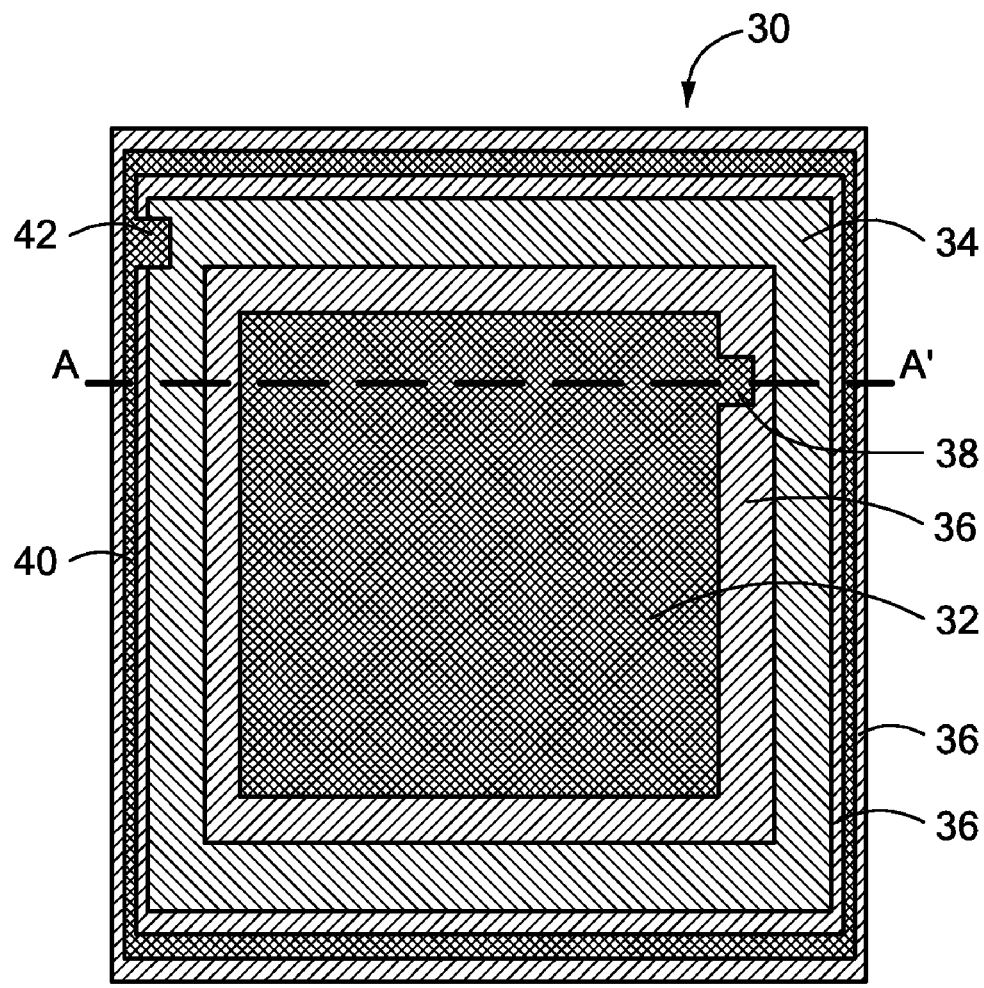
FIG. 3 schematically shows a plan view of a cap with an electrode according to embodiments of the present invention.
Figure 4:
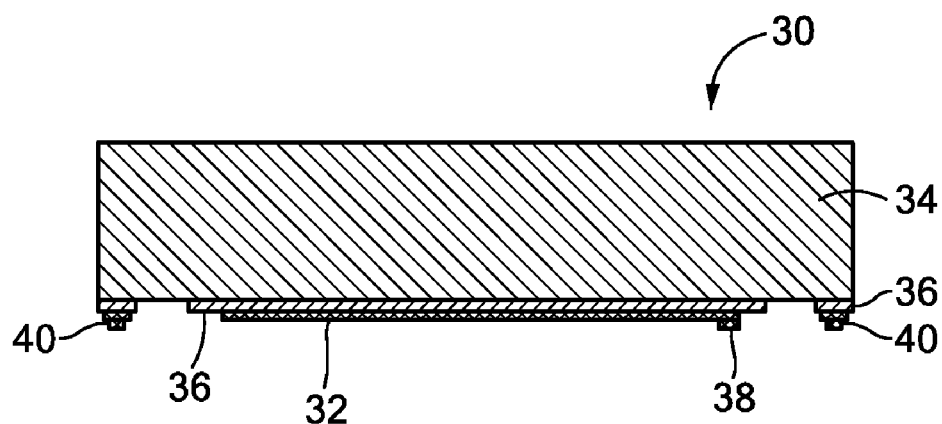
FIG. 4 schematically shows a cross-sectional view of the cap with an electrode along line A-A' of FIG. 3.

In step 110, an electrode is formed on a cap according to embodiments of the present invention. The cap may be formed from a wafer and include one or more layers formed on the wafer. The various layers may be masked off or patterned using processes well known to those skilled in the art, e.g., using photolithography and etching techniques. The wafer may be formed from single crystal silicon, although other materials may be used. For example, FIG. 3 schematically shows a plan view of a cap 30 with an electrode 32 and FIG. 4 shows a cross-sectional view of the cap along line A-A' of FIG. 3 according to an embodiment of the present invention. As shown, the cap 30 includes a conductive cap wafer 34 and a dielectric layer 36 (e.g., oxide, nitride) formed on the cap wafer 34. The dielectric layer 36 may be formed in an area in the center of the cap 30 and may also be formed around its perimeter. The electrode 32 may then be formed in the center of the cap 30 on the dielectric layer 36. The electrode 32 is electrically isolated from the cap 30, to allow the electrode 32 to be used for sensing the z-axis movement as opposed to using the cap 30 itself for the sensing. The electrode 32 may be made from any conductive material, (e.g., aluminum, copper, gold, polysilicon, germanium, and their alloys) and formed by any deposition process, e.g., sputtering, chemical vapor deposition. The electrode 32 may be approximately one or two microns in thickness, although other thicknesses may be used. An electrode contact 38 may be formed on the electrode 32 or in the same plane as the electrode 32 using the same or different materials as the electrode 32. The electrode contact 38 may connect the electrode 32 to the substrate 10 or layers on the substrate 10, e.g., bond pads.

The cap 30 may also have a seal ring 40 formed on the dielectric layer 36 at the perimeter of the cap 30 to be used for attaching the cap 30 to the substrate 10. The seal ring 40 may be formed from any material that provides an appropriate seal or attachment to the substrate 10. The seal ring 40 may be formed during the same deposition process as the electrode 32 and made from the same material as the electrode 32. For example, the seal ring 40 and electrode 32 may be made from aluminum or an aluminum alloy. A particular aluminum alloy considered particularly suitable for use as a seal ring in embodiments of the present invention is aluminum with 1% copper formed using a sputter deposition process. To form the seal ring 40 and the electrode 32, the material may be etched to leave the seal ring 40 and the electrode 32 surrounded by the seal ring 40. The seal ring 40 may have a seal ring contact 42 to the cap wafer 34, which may ground the cap wafer 34 to the substrate to provide an EMI shield in some embodiments.

Figure 5:
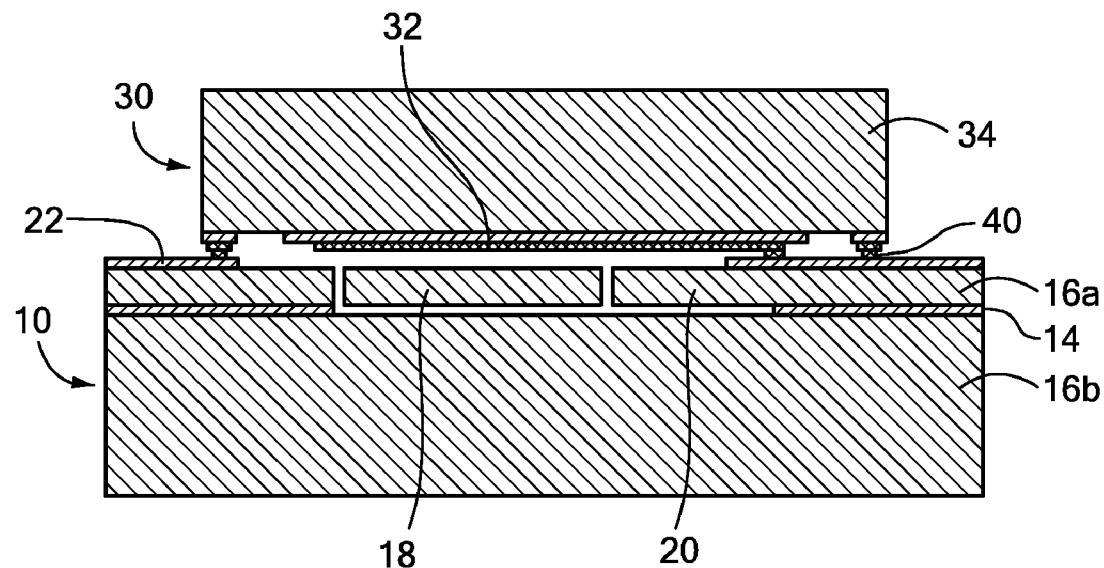
FIG. 5 schematically shows a cross-sectional view of a cap with an electrode attached to a MEMS device according to embodiments of the present invention.

In step 120, the cap 30 is attached to the substrate 10 according to embodiments of the present invention. For example, FIG. 5 schematically shows a cross-sectional view of a cap 30 with an electrode 32 attached to a MEMS device according to an embodiment. The cap 30 is positioned so that the electrode 32 is above the inertial mass 18. The cap 30 may be positioned on the substrate 10 such that the portion of the cap 30 (e.g., the seal ring 40) that contacts the substrate 10 surrounds or circumscribes one or more MEMS structures formed on or in the substrate 10. The cap 30 may also be positioned to surround circuitry formed on or in the substrate 10 and coupled to the MEMS structure. The substrate 10 may include one or more layers formed around the MEMS structure(s) for attaching the cap 30 to the substrate 10. These layers may be formed from conductive or non-conductive materials which may allow the cap 30 to be electrically connected or isolated from the substrate 10. For example, as shown in FIG. 5, the seal ring 40 may attach to a dielectric layer 22 so that the cap 30 may be electrically isolated from the substrate 10. When the seal ring 40 is formed from an aluminum or aluminum alloy layer as mentioned above, the same or similar aluminum-based material may be formed on the substrate 10 to provide a conductive connection. Similar to the seal ring 40, the aluminum-based layer may be approximately one or two microns in thickness, although other thicknesses may be used. For example, the substrate 10 may have a conductive aluminum-based layer (not shown) that is thermocompression bonded to a conductive aluminum-based seal ring 40 under the proper processing conditions (e.g., pressure, temperature, etc.). Details of a bonding process using an aluminum or aluminum alloy are discussed in co-pending U.S. patent application entitled, "ALUMINUM BASED BONDING OF SEMICONDUCTOR WAFERS," filed on Jan. 11, 2008, also naming John R. Martin as an inventor, the disclosure of which is incorporated herein by reference in its entirety.

Although an aluminum seal ring and bonding method are described, other ways of attaching the cap and other materials may be used as known to those skilled in the art. For example, the caps on MEMS sensors often are bonded to the substrate with a glass frit material. Also, polymers and other metal or alloys may be used for the bonding material, although polymers do not provide a hermetic seal.

In some embodiments, the cap 30 may be attached to the substrate 10 to form a hermetic seal. In some embodiments, the cap 30 may include a hole or opening (not shown) through which the ambient or surrounding atmosphere may enter into the MEMS device, allowing the MEMS structure to be exposed to the surrounding atmosphere. Once the cap 30 is attached or bonded to the substrate 10, the cap 30 encapsulates or surrounds the MEMS structure protecting it from hazards such as particles, gases, etc. that might impact the functioning of the MEMS device.

In use, the cap electrode 32 measures the movement of the inertial mass 18 in the z-axis (e.g., toward the electrode 32 and away from the bottom silicon layer 16b) by the change in capacitance. The fixed reference mass 20 provides a reference for the electrode 32 in order to increase the accuracy of its measurement. For example, if operating conditions (e.g., temperature, pressure, humidity) cause the inertial mass 18 to change in any way (e.g., expand, contract), then the reference mass 20 should experience a similar type of change and may be used as a comparison to offset the change from the cap electrode's 32 measurement.

Figure 6:
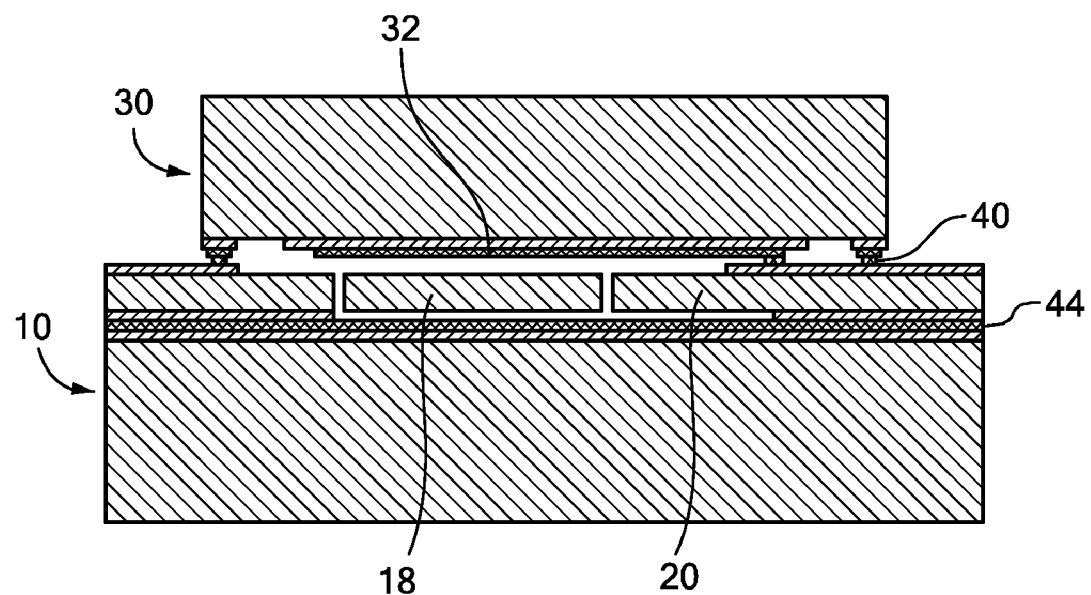
FIG. 6 schematically shows a cross-sectional view of a cap with an electrode attached to a MEMS device having an electrode according to embodiments of the present invention.
Figure 7:
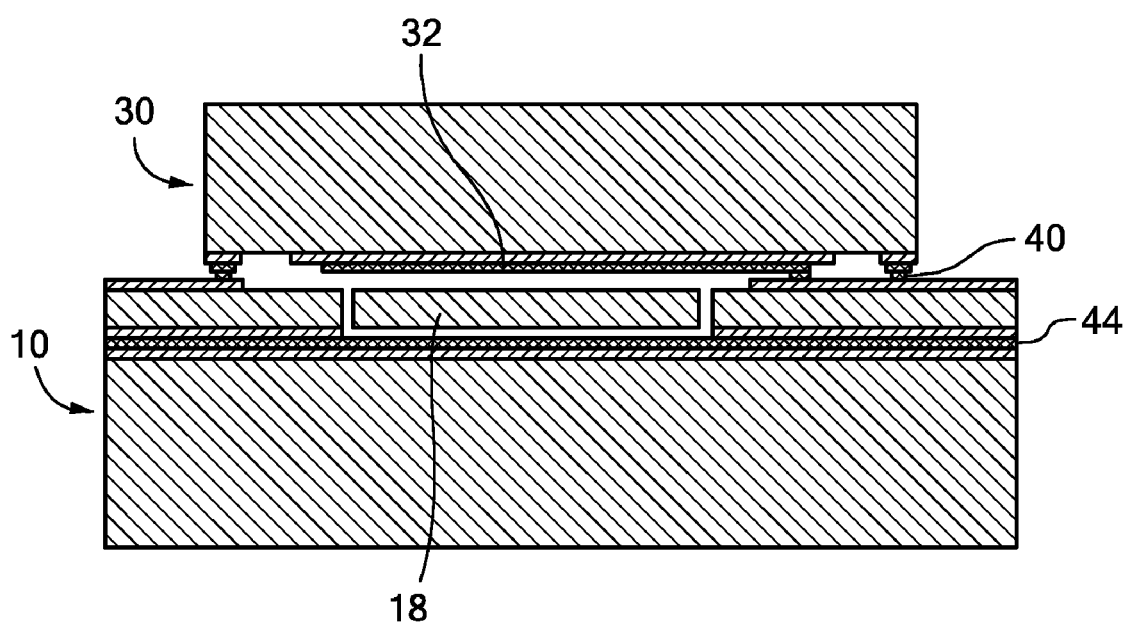
FIG. 7 schematically shows a cross-sectional view of a cap with an electrode attached to a MEMS device having an electrode according to embodiments of the present invention.

Although the substrate 10 has been shown and described in FIGS. 1 and 5 having a certain configuration, other layers and structures may be formed in and/or on the substrate. For example, in a single crystal silicon wafer, the substrate 10 may have additional layers formed on the substrate underneath the MEMS structure, such as shown in FIGS. 6 and 7. FIG. 6 schematically shows a cross-sectional view of a cap with an electrode attached to a MEMS device having an electrode according to embodiments of the present invention. The substrate 10 may include a conductive layer 44 (e.g., polysilicon, germanium, silicon-germanium) formed on the substrate 10 or on top of a dielectric layer formed on the substrate 10. The conductive layer 44 may be patterned and may be used as a second electrode for measuring the z-axis movement of the inertial mass 18. Differential capacitance measurements may then be made of the z-axis movement when both the electrode 32 and the second electrode (conductive layer 44) are used to measure the change in capacitance between the inertial mass 18 and each electrode 32, 44.

For example, when the inertial mass 18 moves up closer to the cap electrode 32 it also moves further away from the second electrode (conductive layer 44). A fixed reference mass 20 may be used, as described above, as a reference for the electrode 32 and/or the second electrode (conductive layer 44) in order to increase the accuracy of the z-axis movement measurements.

FIG. 7 schematically shows a cross-sectional view of a cap with an electrode attached to a MEMS device according to another embodiment of the present invention. As shown, the reference electrode 20 has been eliminated from FIG. 6, potentially reducing the size of the cap 30 and the MEMS device. The z-axis movement of the inertial mass 18 is measured by the change in differential capacitance between the inertial mass 18 and each electrode 32, 44, as described in FIG. 6. Although not shown, a MEMS device for measuring z-axis movement may also be formed by eliminating the cap electrode 32 from FIG. 6 or 7.

To complete the process of producing the MEMS sensor discussed in FIG. 1, other processing steps may be used. For example, if done in a batch process, the wafer(s) may be diced to form a plurality of individual dies. As used herein, the terms "wafer" and "die" may be used interchangeably, although a wafer may form a plurality of individual dies. Some embodiments may implement post-processing methods for integrating the MEMS device with circuitry on the same die or another die. In addition, other processing steps may be performed on the cap wafer to integrate it with packages or other components and/or devices.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS sensor comprising:
 a substrate having a MEMS structure movably attached to the substrate;
 a cap attached to the substrate, the cap encapsulating the MEMS structure;
 an electrode formed on the cap that senses movement of the MEMS structure;
 a reference electrode formed coplanar with the MEMS structure and non-movably attached to the substrate for increasing accuracy of movement measurements of the MEMS structure; and
 a second electrode formed on the substrate beneath the MEMS structure.

2. The MEMS sensor of claim 1, wherein the substrate comprises an SOI wafer.

3. The MEMS sensor of claim 1, wherein the substrate comprises a silicon wafer.

4. The MEMS sensor of claim 1, wherein the electrode is formed from aluminum or an aluminum alloy.

5. The MEMS sensor of claim 1, wherein the electrode is formed from copper, a copper alloy, gold or a gold alloy.

6. The MEMS sensor of claim 1, wherein the cap includes a conductive seal ring formed from aluminum or an aluminum alloy.

7. The MEMS sensor of claim 1, wherein the MEMS sensor is an inertial sensor.

8. The MEMS sensor of claim 1, wherein the MEMS sensor is a pressure sensor, a fluid sensor, or a microphone.

9. The MEMS sensor of claim 1, wherein the substrate further includes electronic circuitry formed on or in the substrate.

* * * * *